PARAMETRIC AMPLIFIER WITH LUMPED CONSTANT TURNABLE RESONANT LOOP IN IDLER CAVITY

Filed Nov. 21, 1962

INVENTORS.
JACQUES R. G. COLLARD
ZDZISLAW A. WOJTOWICZ
BY Alfred C. Hill
AGENT

United States Patent Office 3,195,063 Patented July 13, 1965

3,195,063

PARAMETRIC AMPLIFIER WITH LUMPED CONSTANT TURNABLE RESONANT LOOP IN IDLER CAVITY

Jacques R. G. Collard and Zdzislaw A. Wojtowicz, Nutley, N.J., assignors to International Telephone and Telegraph Corporation, Nutley, N.J., a corporation of Maryland Filed Nov. 21, 1962, Ser. No. 239,223
2 Claims. (Cl. 330—4.9)

This invention relates to parametric amplifiers in general and to single tuned parametric amplifiers in particular. The invention is principally characterized by a novel idler circuit which provides low noise, wide band amplification at very low levels of pump power.

In the past, single tuned parametric amplifiers have suffered from several serious disadvantages, the most notable of which is narrow bandwidth. In a recent book entitled "Semiconductor Diode Parametric Amplifiers," which was published by Prentice-Hall Inc. of Englewood Cliffs, New Jersey, in 1961, the authors comment on this situation as follows: "One of the disadvantages of negative-resistance parametric amplifiers using single tuned circuits is narrow bandwidth. Typical bandwidths of experimental amplifiers at useful values of gain have often been in the order of 1%. Theory indicates that even if we have a perfect amplifier we could not hope for bandwidths much greater than about 5% at 20 db gain when single-tuned circuits are used. Two approaches have been used in an attempt to increase the bandwidth of these devices: the use of traveling-wave circuits, and the use of multiple-tuned circuits." Traveling-wave circuits and multiple tuned circuits, however, add significantly to the weight and complexity of the amplifier, which is highly undesirable in light weight installations such as used in satellite and space craft communication systems. It has been found that the bandwidth of single tuned parametric amplifiers can be improved somewhat by resistively loading the idler circuit, but this is accompanied by a significant increase of noise, which is as undesirable as excess weight and complexity.

Another notable disadvantage of the prior art parametric amplifiers is that they require relatively high levels of pump power. The characteristics of the prior art amplifiers are best when their varactor is fully pumped, i.e. when the instantaneous pump voltage across the varactor is made to vary between the barrier potential and reverse breakdown voltage. This, however, requires a relatively large pump which is undesirable in satellites and space craft.

Accordingly, one object of this invention is to provide a single-tuned parametric amplifier having a wider bandwidth than heretofore known in the art.

Another object of this invention is to provide a single tuned parametric amplifier having a wider bandwidth than heretofore known in the art which can be tuned over its bandwidth without an increase in noise.

Another object of this invention is to provide a single tuned parametric amplifier utilizing a varactor which can be tuned over a wide bandwidth by varying the self-resonance condition of the varactor with an external reactive element.

A further object of this invention is to provide a single-tuned parametric amplifier having wider bandwidth and lower pump power requirements than heretofore known in the art.

An additional object of this invention is to provide a parametric amplifier which is simpler in structure and smaller in size than those heretofore known in the art.

In accordance with the present invention, there is provided within the idler cavity of a parametric amplifier, a tunable resonant loop, this loop including: 1. a variable reactance element; 2. a tuning plunger extending at an angle to said element from one wall of the cavity towards one terminal of the reactance element and providing a reactance in series with said element at said idler frequency, the other terminal of said element being in contact with a second wall of said cavity adjacent said one wall; and 3. the portions of said cavity walls lying within the angle defined by said plunger and reactance element. There is further provided a simplified parametric structure in which both the signal and idler circuits are formed within a common closed coaxial line which is terminated in a variable reactance element in line with the inner conductor, and the pump frequency energy is fed through the side of the coaxial line by waveguide means adapted to block the other frequencies. Tuning is accomplished by a resonant loop formed by a tuning plunger which extends through the side of the coaxial line and by said reactance element, as well as the portions of the coaxial line and its closure member which lie in the angle between said plunger and the reactance element.

Other objects and advantages of the invention will be apparent to those skilled in the art from the following description of several specific embodiments thereof, as illustrated in the attached drawings, in which.

Figures 1, 2, 3:
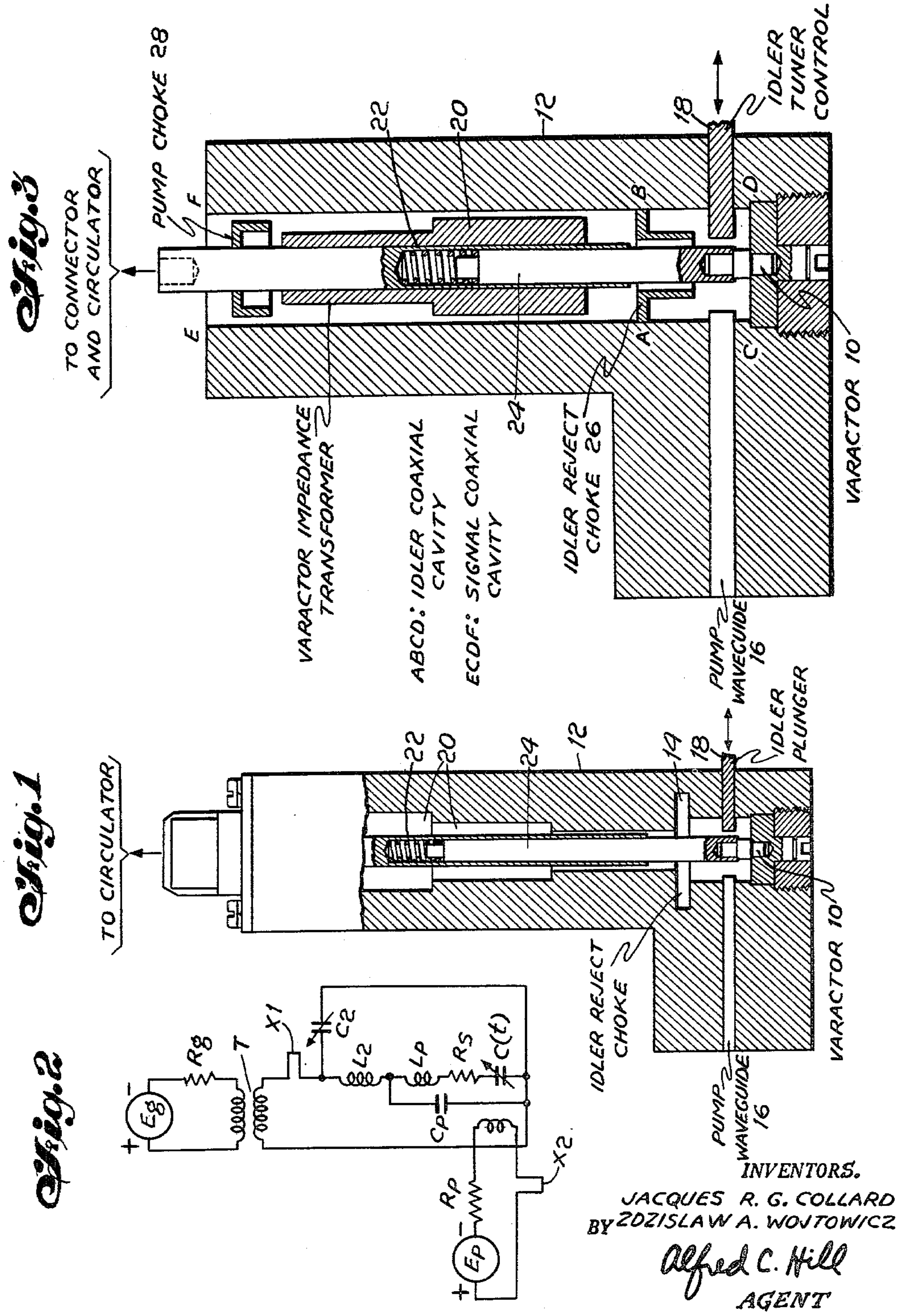
FIG. 1 is an elevation section of one embodiment of the invention.
FIG. 2 is an equivalent circuit for the embodiment disclosed in FIG. 1.
FIG. 3 is an elevation section of another embodiment of the invention.

In general terms, the above noted objects are attained by (1) self-resonating the varactor of the amplifier at idler frequency, (2) isolating the idler circuit from the signal circuit, and (3) partially pumping the varactor about a bias point at or close to zero volts. The choke used to isolate the idler resonant circuit is preferably mounted and located in such a position that it projects an open circuit at the idler tuner position and thus does not affect idler tuning. In addition, the choke is preferably located so that it hides the idler tuner from the signal circuit and, therefore, makes the signal circuit insensitive to different idler tuner positions. The idler tuner is preferably a probe located so as to comprise a tuned loop in combination with the varactor, thereby providing a circuit Q nearly equal to the Q of the varactor at idler frequency. This produces the broadest possible single tuned idler circuit.

FIG. 1 shows one particular mechanization of the foregoing general concepts. A varactor 10 is mounted at the bottom of a coaxial line 12 and a radial idler reject choke 14 is located so that it presents an open circuit to the idler frequency at a plane near the top of the varactor package in line with a pump waveguide 16. The varactor in this structure is tuned to the idler frequency with an idler plunger 18, which forms a resonant loop with the varactor. The pump input is applied to the amplifier from a pump, which is not shown in the drawings, and the signal input-output circuit comprises a circulator, which is also omitted from the drawings. The impedance of the amplifier is matched to the impedance of the signal source by a double quarter wave transformer 20. The pump waveguide 16 is dimensioned so that it does not propagate either the idler or the signal frequency and it is located so that it looks at the varactor backed by an RF short circuit. The varactor must therefore magnetically couple into the sinusoidal pump wave. The pump current induced must, therefore, also be sinusoidal. This highly efficient pumping mode, which is very difficult to achieve in the prior art amplifiers, makes it possible to use a tunnel diode oscillator as a pump for the amplifier of this invention.

FIG. 2 shows an equivalent circuit for the above described embodiment of the invention. The symbols appearing in this figure are defined as follows:

$E_g$—signal source.
$R_g$—signal source impedance.
T—signal transformer.
$X_1$—idler frequency choke.
$E_p$—pump source.
$X_2$—signal and idler frequency chokes.
$R_p$—pump source impedance.
$C_p$—varactor package capacitance.
$R_s$—varactor series resistance.
$L_p$—varactor lead inductance.
$L_2$—inductance of the diode holder.
$C(t)$—variable capacitance of the varactor.
$C_2$—capacitance of the tuning gap.

It will be noted in the circuit of FIGS. 1 and 2 that the idler circuit is tuned by means of a variable gap between the varactor and the tuning plunger 18. The gap, of course, produces the variable capacitance $C_2$, which is adjusted by moving idler plunger 18 in and out. The reason for using a variable gap in this embodiment is that the varactor and holder constitute a slightly inductive load which can only be tuned out by a variable capacitance. The idler frequency is not, therefore, confined to the natural resonant frequency of the varactor by itself. The holder and/or the position of the idler choke can be used to modify this resonant frequency if desired. In this particular embodiment, the central member 22 of coaxial chamber 12 contains a spring loaded plunger 24 which is adapted to make pressure contact with the shoulder contact of varactor 10. This particular mounting is not essential to the invention, but it is preferable for varactor packages which contain a shoulder contact.

FIG. 3 shows a second embodiment of the invention which is similar to the embodiment of FIG. 1 but which uses a cup choke 26 for the idler reject choke in place of a radial choke. The cup choke, however, performs the same function as the radial choke, i.e. it projects an open circuit to the idler frequency at a plane near the top of the ceramic package of varactor 10 in line with the pump waveguide. The embodiment of FIG. 3 also differs in containing a pump choke 28, which prevents pump power from leaking into the signal circuit, and by having double quarter wave transformer 20 formed on the central member 22 of coaxial chamber 12 rather than on the outer member. It should be noted here that the transformer 22 is preferably located in the transmission line in such position that it tunes out the reactive element of the varactor at signal frequency by its diameter discontinuity. The circuit of FIG. 2 is also equivalent to the embodiment of FIG. 3, with the exception of pump choke 28, which is not shown in FIG. 2.

The varactor is preferably selected to have high Q, for low noise performance. This leads to a high optimum idler frequency and a correspondingly low idler Q leading to wide idler bandwidth. In one specific embodiment, a graded junction varactor ($\tau=1/3$) was used which had a cutoff frequency of 200 kmc., a series resistance $R_s$ of 5 ohms, a normalized power of 20 watts, and a package capacitance of 0.3 pf. With this diode, voltage gain bandwidth products larger than 300 mc. have been obtained with a pump power smaller than one milliwatt.

From the foregoing description it will be apparent that this invention provides a single tuned parametric amplifier having a wider bandwidth and lower pump power requirements than heretofore known in the art. And it should be understood that the invention is by no means limited to the embodiments disclosed herein, since many modifications can be made in the structure disclosed without departing from the basic teaching of this application. For example, it is not necessary to use a varactor as the variable impedance element in this invention. A variable inductance element such as a ferrite might be used if desired. Furthermore, an LCLC ladder network could be used in place of the radial and cup chokes disclosed herein. These and many other modifications of the invention will be apparent to those skilled in the art, and this invention includes all modifications falling within the scope of the following claims.

What is claimed is:

1. A parametric amplifier structure comprising a coaxial line providing the signal and idler frequencies resonant circuits,
   a closure member at one end of said line, a variable reactance element having a self-resonance frequency mounted between said closure member and the end of the inner conductor of said line in series with and aligned with said inner conductor,
   means forming a lumped constant tunable resonant loop in said coaxial line for tuning over a frequency band including the self-resonance frequency of said element, said loop including:
      (1) said variable reactance element,
      (2) a movable tuning plunger extending through the outer conductor of said coaxial line towards the terminal of said element adjacent said inner conductor, and forming a reactance at the idler frequency in series therewith,
      and (3) the portions of said closure member and said outer conductor lying within the angle defined by said plunger and said element,
   and a waveguide for the pump frequency energy extending through said outer conductor into the coaxial cavity at a level adjacent said tuning plunger, said waveguide having a cut-off frequency characteristic blocking propagation of said signal and idler frequencies therethrough, said pump frequencies being higher than either said idler or signal frequencies.

2. A single tuned parametric amplifier comprising a coaxial line having an inner and outer conductor,
   a conductive closure member at one end of said line closing said end of the line,
   a varactor diode having a self-resonance frequency adjacent one end of said line coaxially aligned with and extending from the end of said inner conductor towards said closure member and having one terminal in contact with said inner conductor and the other terminal in contact with said closure member,
   means forming a lumped constant tunable resonant loop for the idler frequency for tuning over a frequency band including the self-resonance frequency of said diode, said loop including:
      (1) said varactor diode,
      (2) a movable tuning probe extending from the outer conductor into the cavity between said inner and outer conductor, towards said one terminal to form a capacity in series therewith, which capacity is a short circuit at the pump frequency but a substantial reactance at the idler frequency, said loop being tuned over a frequency band centering at the natural frequency of said varactor diode,
      and (3) a portion of the outer conductor and closure member lying within the angle defined by said diode and said probe,
   a waveguide for the pump frequency extending through said outer conductor into the coaxial cavity at a level adjacent said tuning probe and having an inner dimension to block propagation at both the idler frequency and the signal frequency
   and means positioned in said coaxial line dividing it into a first area adjacent said diode and a second area extending from said first area to the remote end of said coaxial line, for blocking propagation of energy at said idler frequency from said first area into said second area, while permitting propagation of energy at said signal frequency from said second area into said first area, said pump frequency being higher than either the idler or signal frequencies, and the idler frequencies being higher than the signal frequencies.

References Cited by the Examiner

UNITED STATES PATENTS

| | | | |
|---|---|---|---|
| 3,105,941 | 10/63 | Kliphuis | 330—4.9 |
| 3,119,073 | 1/64 | Harris | 330—4.9 |
| 3,120,644 | 2/64 | Boxer | 330—4.9 |

OTHER REFERENCES

German Printed application 1,137,775, October 1962.

Bossard et al.: "Proceedings of the IRE," March 1962, pages 328-329.

Bossard et al.: "Proceedings of the IRE," October 1962, pages 2110-2111.

Kliphuis: "Proceedings of the IRE," May 1961, page 961.

ROY LAKE, *Primary Examiner.*

BENNETT G. MILLER, *Examiner.*